(12) United States Patent
Iyer et al.

(10) Patent No.: US 6,433,404 B1
(45) Date of Patent: Aug. 13, 2002

(54) ELECTRICAL FUSES FOR SEMICONDUCTOR DEVICES

(75) Inventors: Sundar K. Iyer, Beacon; Chandcasekhar Narayan, Hopewell Jct; Axel Brintzinger, Fishkill; Subramanian Iyer, Mt. Kisco, all of NY (US)

(73) Assignees: Infineon Technologies AG, Munich (DE); International Business Machines Corporation, Armonk, NY (US)

(*) Notice: Subject to any disclaimer, the term of this patent is extended or adjusted under 35 U.S.C. 154(b) by 0 days.

(21) Appl. No.: 09/499,495

(22) Filed: Feb. 7, 2000

(51) Int. Cl.[7] .............................................. H01L 29/00
(52) U.S. Cl. ....................... 257/529; 438/132; 438/333; 438/601
(58) Field of Search ........................... 257/529; 438/601, 438/132, 333, 215, 281, 467

(56) References Cited

U.S. PATENT DOCUMENTS

| | | | | | |
|---|---|---|---|---|---|
| 4,740,485 A | * | 4/1988 | Sharpe-Geisler | ............ | 437/228 |
| 5,789,970 A | * | 8/1998 | Denham | ...................... | 327/525 |
| 5,882,998 A | * | 3/1999 | Sur, Jr. et al. | ............... | 438/601 |
| 5,969,404 A | * | 10/1999 | Bohr et al. | .................. | 257/529 |
| 6,175,145 B1 | * | 1/2001 | Lee et al. | .................... | 257/529 |

* cited by examiner

*Primary Examiner*—Steven Loke
*Assistant Examiner*—Douglas W. Owens
(74) *Attorney, Agent, or Firm*—Stanton Braden

(57) ABSTRACT

A fuse for semiconductor devices, in accordance with the present invention, includes a cathode formed from a first material, an anode formed from a second material and a fuse link connecting the cathode and the anode and formed from the second material. The second material is more susceptible to material migration than the first material when the fuse is electrically active such that material migration is enhanced in the second material.

18 Claims, 4 Drawing Sheets

ELECTRICAL FUSES FOR SEMICONDUCTOR DEVICES

BACKGROUND

1. Technical Field

This disclosure relates to fuses for semiconductor devices and more particularly, to electrical fuses with characteristics to enhance the efficiency of fuse programming.

2. Description of the Related Art

In semiconductor devices, fuses are employed in a variety of applications. For example, fuses are employed to enable redundant elements to be employed in the case of failures encountered on the semiconductor device. One type of fuse includes an electrically programmable fuse. These fuses may include poly-silicide. Poly-silicide includes polycrystalline silicon and an overlayer of silicide, such as a metal silicide. The electrically programmable fuses typically include an appropriately shaped polysilicon layer that is silicided to obtain a poly-silicon/metal silicide stack structure.

Referring to FIG. 1, a layout (shape) of a fuse 10 is shown. Fuse 10 includes a fuse link 12, an anode 14 and a cathode 16. Current crowding takes place around a location 18 where the fuse link 12 abuts the cathode 16, when a bias is applied to set or program the fuse. The current crowding initiates electro-migration effects at the fuse link 12 resulting in further current crowding and finally for appropriate bias conditions, the poly-silicide line melts or the silicide agglomerates to result in an open circuit or a high resistance state (i.e., the fuse gets programmed) at the location 18. The effect of material migration due to, for example, electro-migration can be increased at the cathode-fuse link junction by increasing the ratio of $L_{cathode}$ to $L_{fuse}$, as this encourages current crowding. In typical layouts, the thickness of the fuse link 12, the anode 14 and the cathode 16 are the same thickness because they are formed on the same level. Therefore, the lengths of $L_{cathode}$ and $L_{fuse}$ are determinative of the effective cross-sectional area of the fuse link/anode intersection. A polysilicon layer 20 and a suicide layer 22 as shown in FIG. 2 are provided at a uniform thickness for the fuse link 12, the anode 14 and the cathode 16. A nitride capping layer 24 is also provided over layers 20 and 22.

Typical electrically programmable fuses require current flow and voltage levels at an appropriate level for a requisite amount of time to program the fuse. Therefore, a need exists for an apparatus and method to initiate and aid mass transport processes near a fuse link/cathode intersection to reduce the programming current, voltage and time. These reductions are desirable for the electrical fuse technology to minimize energy consumption and the cost of programming fuses.

SUMMARY OF THE INVENTION

A fuse for semiconductor devices, in accordance with the present invention, includes a cathode formed from a first material, an anode formed from a second material and a fuse link connecting the cathode and the anode and formed from the second material. The second material is more susceptible to material migration than the first material when the fuse is electrically active such that material migration is enhanced in the second material.

In alternate embodiments, the first material may include polysilicon, and the second material may include a silicide. The second material may also include silicided polysilicon. The cathode preferably has a larger cross-sectional area than the fuse link. The first material and the second material between the cathode and the fuse link may provide an interface which is substantially perpendicular to a current flow direction through the fuse link. The second material preferably includes electromigration properties which are greater than the electromigration properties of the first material. The second material may include one of Al, Cu and Au. The first material may include one of W, Mo and TiN. The second material/first material preferably include pairs which include one of Al/W, Cu/TiN and Cu/W, respectively.

Another fuse for semiconductor devices, in accordance with the present invention, includes a conductive pattern formed on a substrate, the conductive pattern forming a cathode on a first end portion. A fuse link is connected to the cathode and an anode. The anode is formed on a second end portion of the conductive pattern. A material having a higher mass transport rate than material employed to form the conductive pattern is formed on the anode and the fuse link to provide a material migration susceptibility for the fuse link which is greater than the material migration susceptibility of the cathode such that when the fuse is electrically active material migration is enhanced in the fuse link.

In other embodiments, the material of the conductive pattern may include polysilicon. The material having a higher mass transport may include a silicide. The cathode and the fuse link may provide an interface which is substantially perpendicular to a current flow direction through the fuse link. The cathode preferably has a larger cross-sectional area than the fuse link.

Still another fuse for semiconductor devices, in accordance with the present invention, includes a polysilicon pattern formed on a substrate. The polysilicon pattern forms a cathode on a first end portion. A fuse link is connected to the cathode and an anode. The anode is formed on a second end portion of the polysilicon pattern. A silicide material is formed on the anode and the fuse link to provide an electromigration susceptibility for the fuse link which is greater than the electromigration susceptibility of the cathode, such that, when the fuse is electrically active, electromigration is enhanced in the fuse link.

In alternate embodiments, the cathode preferably has a larger cross-sectional area than the fuse link. The polysilicon of the cathode and the silicide of the fuse link may provide an interface which is substantially perpendicular to a current flow direction through the fuse link.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides an apparatus and a method to initiate and aid material migration near a fuse link/cathode intersection to perform a fusing operation. In one embodiment, the intersection includes a cathode material, which is different from the anode/fuse link material, such that material migration is enhanced to provide a break or increased resistance in the fuse link in less time and with less severe current and/or voltage levels. In one embodiment, a silicided portion is employed for the anode and the fuse link, and a polysilicon portion is employed for the cathode. This structure advantageously reduces the programming current, voltage and time.

One embodiment of the present invention provides a selectively silicided structure which exacerbates the material migration process further by cutting off the supply of silicide from the cathode, thus initiating the voids in the cathode-fuse link junction at a faster rate. The higher conductivity of the silicide also provides current crowding in the vertical direction at the fuse link and cathode junction further aiding electron migration. This abetting of the material migration process by selective silicidation advantageously permits lower programming voltage/current and shorter programming time. In one embodiment, voltages and/or current are reduced by a factor of at least two and the programming time is reduced by a factor of about 100. Although described in terms of silicide and polysilicon materials, these materials should not be construed as limiting the present invention. Instead, these materials are employed to illustrate the present invention in one application.

Figure 1:
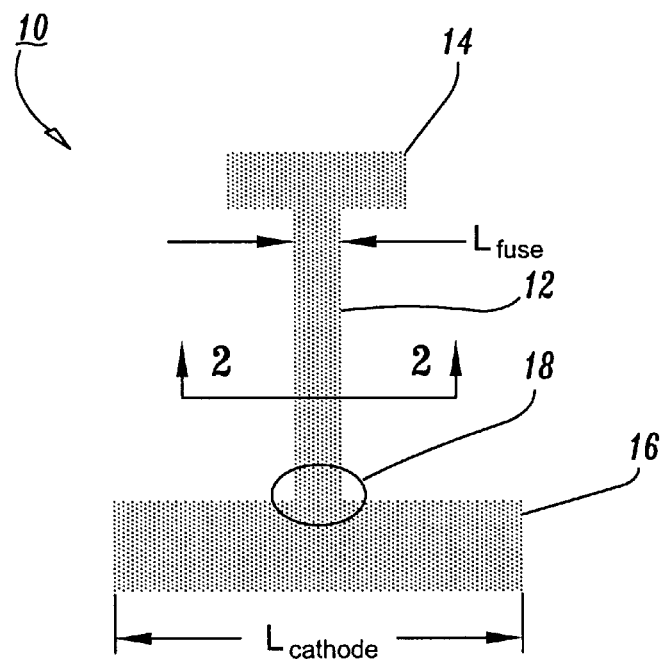
FIG. 1 is a top view of a fuse structure in accordance with the prior art.
Figure 2:
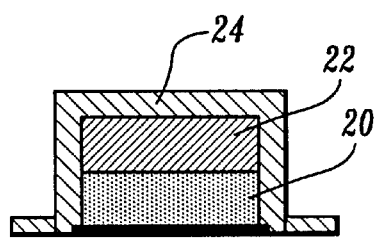
FIG. 2 is a cross-sectional view of a fuse link for the fuse structure of FIG. 1.
Figure 3:
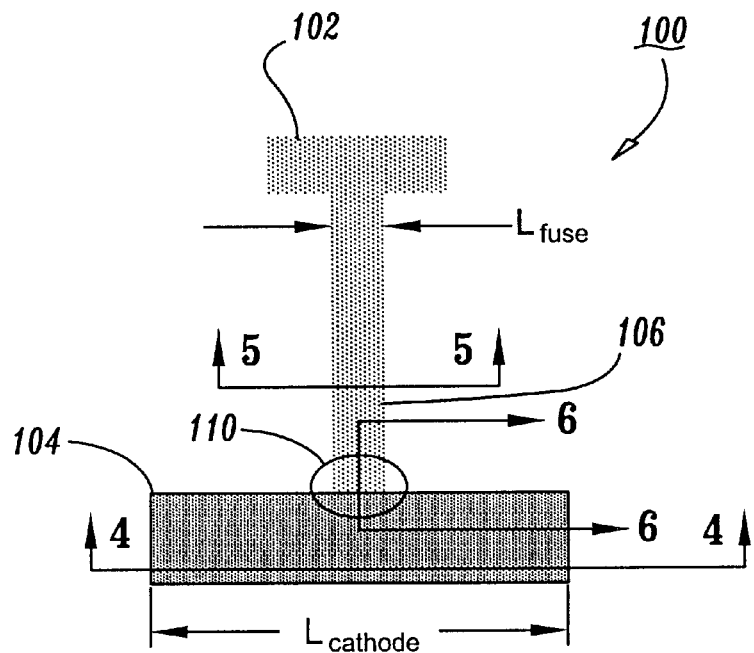
FIG. 3 is a top view of a fuse structure for enhancing mass migration (and/or electro-migration) in accordance with the present invention.

Referring now in specific detail to the drawings in which like reference numerals identify similar or identical elements throughout the several views, and initially to FIG. 3, a fuse structure or fuse 100 is shown in accordance with the present invention. Fuse 100 includes an anode 102 and a cathode 104 for providing current flow across a fuse link 106 that connects anode 102 to cathode 104. Anode 102, cathode 104 and fuse link 106 are preferably disposed on a substrate 101 (see FIGS. 4–7), which may include a semiconductor substrate, diffusion regions, metal lines, dielectric layer and other components. When fuse 100 is programmed, cathode 104 is negatively biased and anode 102 is positively biased. A reduction in cross-sectional area (which is proportional to the width in this embodiment) from $L_{cathode}$ to $L_{fuse}$ results in current crowding in a region 110. The increased current density will result in material migration (or electro-migration) in region 110. The material migration causes voids to form at the corners of fuse link 106 and cathode 104, further increases the current density. This ultimately results in fuse link 106 melting thereby causing an open in the fuse circuit or a material segregation thereby causing an increased resistance in the fuse.

FIG. 3 is a top view of fuse structure 100. In accordance with the present invention, cathode 104 of fuse structure 100 includes a material, which is less susceptible to material migration than anode 102 and fuse link 106. Preferably, at an intersection between cathode 104 and fuse link 106 a well-defined delineation of materials is provided. In this way, material migration effects are advantageously enhanced as well as concentrated or focused in a much smaller region, e.g., the intersection of cathode 104 and fuse link 106.

If a poly-silicide structure is employed for fuse 100, then cathode 104 is not silicided, e.g., cathode 104 is made of only heavily doped polysilicon. Anode 102 and fuse link 106 are preferably polysilicon with a silicide layer formed thereon.

Figure 4:
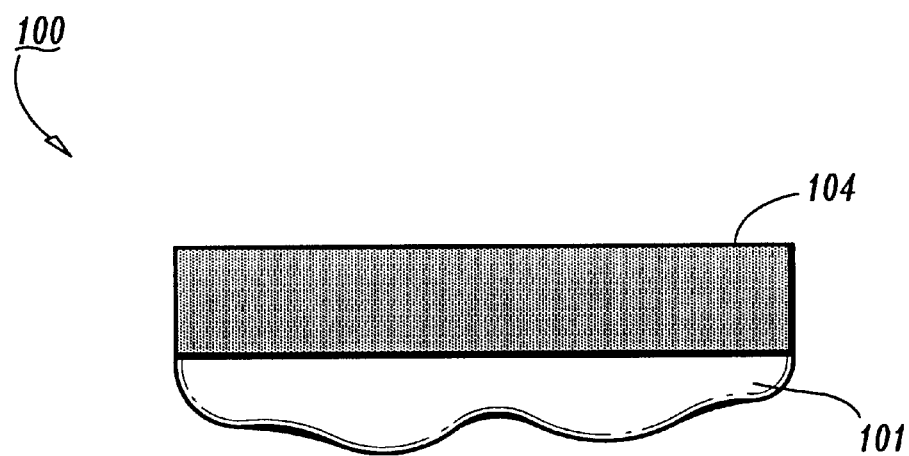
FIG. 4 is a cross-sectional view of a cathode taken at section line 4—4 of FIG. 3 in accordance with the present invention.
Figure 5:
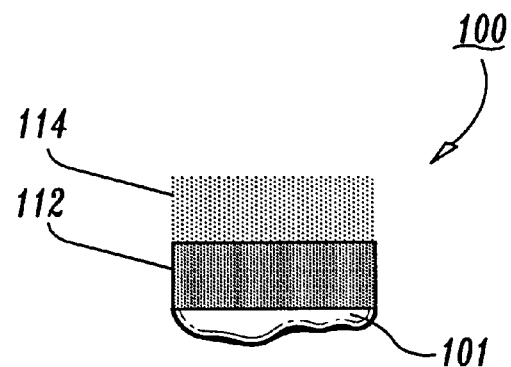
FIG. 5 is a cross-sectional view of a fuse link taken at section line 5—5 of FIG. 3 in accordance with the present invention.
Figure 7:
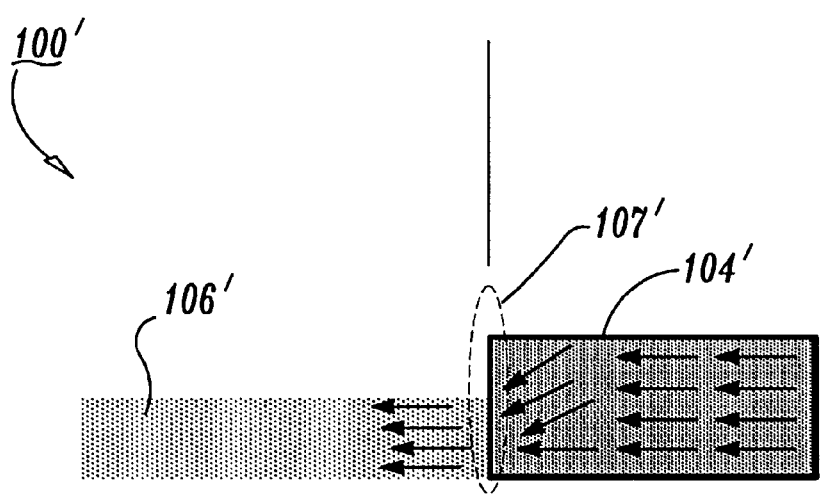
FIG. 7 is a cross-sectional view of another embodiment of the fuse link to cathode junction taken at section line 6—6 of FIG. 3 in accordance with the present invention.

Referring to FIG. 4, a cross-sectional view of fuse 100 taken at section line 4—4 shows cathode 104 formed from a single material, e.g., unsilicided polysilicon. Turning to FIG. 5, a cross-sectional view of fuse 100 taken at section line 5—5 shows fuse link 106 formed from a layer of polysilicon material 112, e.g., unsilicided polysilicon, having a silicide layer 114 formed thereon (e.g., silicided polysilicon). It should be noted that the present invention may include a single material for fuse link 106 and a different material for cathode 104 (FIG. 7).

Figure 6:
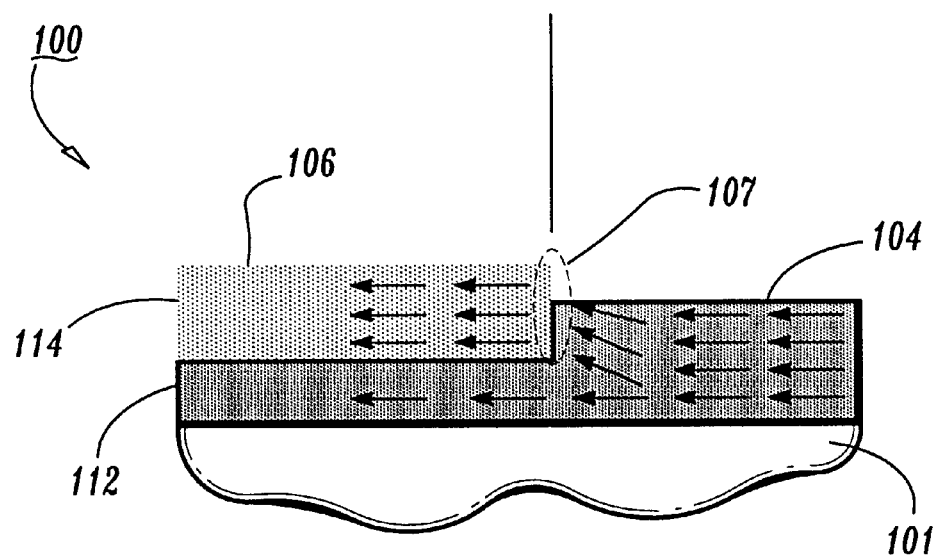
FIG. 6 is a cross-sectional view of the fuse link to cathode junction taken at section line 6—6 of FIG. 3 in accordance with the present invention.

Referring now to FIG. 6, a cross-sectional view of fuse 100 taken at section line 6—6 shows a cathode to fuse link interface from region 110. The selective silicidation of fuse structure 100 can be achieved by employing a masking layer during the silicidation (or salicidation) process of the polysilicon. In this way, cathode 104 is protected from the silicidation (or salicidation) process. The silicide formation process consumes some of the polysilicon in fuse link 106. Hence, polysilicon layer 112 is thinner than the polysilicon of cathode 104.

When this structure is biased with the negative voltage applied to cathode 104 and positive voltage to anode 102, the Aelectron wind@ (as indicated by arrows) will push the silicide molecules, especially in fuse link 106 where the current density is higher. Since cathode 104 is not silicided and includes polysilicon, the silicide in fuse link 106 that is moved towards the anode by the electron wind is not replaced at fuse link-cathode junction and a void is created. In this case, polysilicon is less affected than silicide by electron migration. Other forces, such as, for example, surface tension, may also play a role in increasing fuse link 106 resistance by the agglomeration of silicide.

Since the silicide has much lower resistivity than the polysilicon, most of the electrons that carry the current will be crowded in the silicide in fuse-link 106 at the junction of the silicide and the un-silicided junction. Advantageously, this current crowding in the vertical direction at a substantially perpendicular interface 107 adds to the crowding due the shape of the large cathode connected to the thin fuse-link, and further amplifies the material migration effect at this junction. The fuse programming therefore takes place for fuse 100 much faster and at a lower voltage/current.

The present invention may be extended to any junction formed with a high material migrating substance and a lower material migration substance. The highly migrating material is preferably connected to the anode and lower migrating material is connected to the cathode. Such a structure, by creating a high current density at the junction, can be used as an electrical fuse. Highly migrating materials may include Al, Cu, and Au and lower migrating materials may include W, Mo and TiN (titanium nitride). The high/low migrating materials may include the following high/low migration pairs Al/W, Cu/TiN and Cu/W. Other materials are also contemplated. Combinations of several materials or layers of materials may also be employed by the present invention.

Referring now to FIG. 7, a cross-sectional view of fuse 100' taken at section line 6—6 shows another embodiment of the present invention. A cathode 104' includes a first material having low material migration susceptibility while fuse link 106' includes a different material with high material migration susceptibility to provide enhanced material migration at the cathode fuse link interface. Different thicknesses of cathode 104' and 106' may also be employed to further increase electron crowding in region 107'.

Having described preferred embodiments for improved electrical fuses for semiconductor devices (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A fuse for semiconductor devices comprising:
   a cathode comprising a first material;
   an anode comprising a second material;
   a fuse link connecting the cathode and the anode and comprising the second material;
   wherein the cathode and the fuse link provide an interface which is transverse to a current flow direction through the fuse link, said interface having a smaller lateral and longitudinal transverse dimensions than the cathode; and
   the second material being more susceptible to material migration than the first material when the fuse is electrically active such that material migration is enhanced in the second material.

2. The fuse as recited in claim 1, wherein the first material comprises polysilicon.

3. The fuse as recited in claim 2, wherein the second material comprises a silicide.

4. The fuse as recited in claim 3, wherein the second material comprises silicided polysilicon.

5. The fuse as recited in claim 1, wherein the cathode has a larger cross-sectional area than the fuse link.

6. The fuse as recited in claim 1, wherein the first material and the second material between the cathode and the fuse link provide an interface which is substantially perpendicular to a current flow direction through the fuse link.

7. The fuse as recited in claim 1, wherein the second material possesses electromigration properties which are greater than the electromigration properties of the first material.

8. The fuse as recited in claim 1, wherein the second material comprises one of Al, Cu and Au.

9. The fuse as recited in claim 1, wherein the first material comprises one of W, Mo and Ti'N.

10. The fuse as recited in claim 1, wherein the second material/first material comprises one of Al/W, Cu/Ti'N and Cu/W, respectively.

11. A fuse for semiconductor devices comprising:
    a conductive pattern formed on a substrate, the conductive pattern forming a cathode on a first end portion;
    a fuse link connecting the cathode and an anode, the anode being formed on a second end portion of the conductive pattern;
    wherein the cathode and the fuse link provide an interface which is transverse to a current flow direction through the fuse link, said interface having a smaller lateral and longitudinal transverse dimensions than the cathode; and
    a material having a higher mass transport rate than material employed to form the conductive pattern is formed on the anode and the fuse link to provide a material migration susceptibility for the fuse link which is greater than the material migration susceptibility of the cathode such that when the fuse is electrically active material migration is enhanced in the fuse link.

12. The fuse as recited in claim 11, wherein the material of the conductive pattern comprises polysilicon.

13. The fuse as recited in claim 12, wherein the material having a higher mass transport comprises a silicide.

14. The fuse as recited in claim 11, wherein the cathode and the fuse link provide an interface which is substantially perpendicular to a current flow direction through the fuse link.

15. The fuse as recited in claim 11, wherein the cathode has a larger cross-sectional area than the fuse link.

16. A fuse for semiconductor devices comprising:
    a polysilicon pattern formed on a substrate, the polysilicon pattern forming a cathode on a first end portion;
    a fuse link connecting the cathode and an anode, the anode being formed on a second end portion of the polysilicon pattern;
    wherein the cathode and the fuse link provide an interface which is transverse to a current flow direction through the fuse link, said interface having smaller lateral and longitudinal transverse dimensions than the cathode; and
    a silicide material formed on the anode and the fuse link to provide an electromigration susceptibility for the fuse link which is greater than the electromigration susceptibility of the cathode, such that, when the fuse is electrically active, electromigration is enhanced in the fuse link.

17. The fuse as recited in claim 16, wherein the cathode has a larger cross-sectional area than the fuse link.

18. The fuse as recited in claim 16, wherein the polysilicon of the cathode and the silicide of the fuse link provide an interface which is substantially perpendicular to a current flow direction through the fuse link.

* * * * *